United States Patent [19]
Mui et al.

[11] Patent Number: 5,711,677
[45] Date of Patent: Jan. 27, 1998

[54] MULTI-FUNCTIONAL I/O CARD GUIDE

[75] Inventors: Paul K. Mui, Boise; R. Scott Johnson, Nampa; Bruce G. Johnson, Eagle; Wayne A. Albright, Nampa; Eric L. Bokman, Boise, all of Id.

[73] Assignee: Hewlett-Packard Company, Palo Alto, Calif.

[21] Appl. No.: 585,995

[22] Filed: Jan. 11, 1996

[51] Int. Cl.⁶ .................................................. H01R 9/09
[52] U.S. Cl. ........................................................ 439/64
[58] Field of Search .............................. 439/64, 65, 76.1, 439/78, 79, 325, 326, 631, 632, 634, 570

[56] References Cited

U.S. PATENT DOCUMENTS

| | | | |
|---|---|---|---|
| 4,109,300 | 8/1978 | Reimer | 361/415 |
| 4,550,362 | 10/1985 | Reimer | 361/415 |
| 4,568,134 | 2/1986 | DiMondi | 439/64 |
| 4,592,610 | 6/1986 | Bowls | 339/65 |
| 4,698,024 | 10/1987 | Maxwell | 439/62 |
| 4,861,277 | 8/1989 | Bina | 439/377 |
| 5,055,061 | 10/1991 | Lichtenwalter | 439/377 |
| 5,176,523 | 1/1993 | Lai | 439/64 |
| 5,297,966 | 3/1994 | Brennian, Jr. et al. | 439/570 |
| 5,404,275 | 4/1995 | Zenitani et al. | 439/64 |
| 5,584,706 | 12/1996 | Hung | 439/64 |

*Primary Examiner*—Neil Abrams
*Assistant Examiner*—Yong Ki Kim
*Attorney, Agent, or Firm*—Lane R. Simmons

[57] ABSTRACT

A multi-functional I/O card guide snap mounts to a mother board and houses a slidably removable I/O card for interfacing the I/O card with the mother board. The card guide includes a snap mountable daughter card for bridging the connection between the I/O card and the mother board. The card guide serves as a guide for accurately and easily slidably interfacing the I/O card with the daughter card, and serves as a connector for interfacing the I/O card and daughter card with the mother board. The card guide provides alignment accuracy between the I/O card and the interfacing daughter card connector because of a short tolerance path therebetween and inherent coplanar accuracy. Advantageously, no custom parts are required like conventional high rise connectors, and no extra mounting space or hardware is required like conventional backplane connector systems.

8 Claims, 8 Drawing Sheets

MULTI-FUNCTIONAL I/O CARD GUIDE

FIELD OF THE INVENTION

This invention relates in general to connecting printed circuit assembly cards to electronic equipment and, more specially, to an apparatus for providing an improved means and method for connecting the cards to a host.

BACKGROUND OF THE INVENTION

Printed circuit assembly (PCA) cards are commonly used in the electronics and computing industries for many purposes and in many differing systems. Many PCA cards are designed and manufactured for interconnecting with other PCA cards or electronic components. These interconnecting cards often provide input/output (I/O) operations for the system in which they are used. Conventional I/O cards interface with a system board (i.e., a mother/system board or host PCA card) through high rise connectors mounted on the system board, or with a remote mounted backplane and guiding rail system associated with the system board.

A high rise connector is a connector that is mounted to a host card by means of extended lens to elevate the connector socket above the host to a predefined height for allowing an I/O card connector to interface with it. High rise connectors typically present many cost, manufacturing, and performance problems. High rise connectors are costly because they are unique custom parts that require special engineering and tooling designs. They are custom parts because each high rise connector may have different specifications, for example height and width measurements, to interface with the system board and I/O card for which the connector is produced. Since high rise connectors are custom parts, their volumes are lower than standard connectors and, as a result, cost more.

From a manufacturing perspective, high rise connectors typically have a 10–20% cycle time penalty (with respect to automated pick and place equipment) during printed circuit board (PCB) assembly due to handling speed reduction and complex approach requirements. For example, high rise connectors require special robotic arm grippers that limit use with other connectors which can place constraints on PCB assembly cycle time optimization. Furthermore, special low volumetric density trays are required to package high rise connectors, and special feeders are required to feed the high rise connectors because they are not vertically stable.

Other disadvantages of high rise connectors include the fact that they have high tolerance stack-up because they are more tilt sensitive. Retention devices are often required to support the high rise connector, to counteract high torque during insertion of an I/O card, and to prevent shearing of the connector. Misalignment and non-contact of the I/O card with the connector may result due to bending of the connector and the higher tolerance stack-up.

Finally, high rise connectors typically have long exposed leads which interface the connector with a system board. As such, electronic signal integrity is not easily maintained due to radio frequency interference (RFI) from the exposed leads which act as antennas.

Alternative to the use of a high rise connector, a remotely mounted backplane disposed on an orthogonal plane to the system board is often used to connect an I/O card to the system board. However, costs, enclosure space, and manufacturability are the main disadvantages of a remotely mounted backplane. For example, such configurations easily cause misalignment between the I/O card and an interfacing connector in the backplane because of the large tolerance stack-up between the two different mounting planes for the system board and the backplane. Furthermore, additional space and mounting hardware are required in the enclosure for the backplane. As such, manufacturing cycle times are unavoidably increased to install a backplane.

Accordingly, given the aforementioned limitations of conventional technologies, objects of the present invention are to provide an improved system and method for interfacing I/O cards with a system board.

SUMMARY OF THE INVENTION

According to principles of the present invention in a preferred embodiment, a multi-functional I/O card guide snap mounts to a mother board and houses a slidably removable I/O card for interfacing the I/O card with the mother board. The card guide includes a snap mountable daughter card for bridging the connection between the I/O card and the mother board. The card guide is multi-functional because it serves as a guide for accurately and easily slidably interfacing the I/O card with the daughter card, and serves as a connector for interfacing the I/O card and daughter card with the mother board.

The present invention card guide requires no custom parts like conventional high rise connectors, and requires no extra mounting space and hardware like conventional backplane connector systems. The card guide provides alignment accuracy between the I/O card and the interfacing daughter card connector because of a short tolerance path therebetween and inherent coplanar accuracy.

Other objects, advantages, and capabilities of the present invention will become more apparent as the description proceeds.

DETAILED DESCRIPTION OF THE INVENTION

Figure 1:
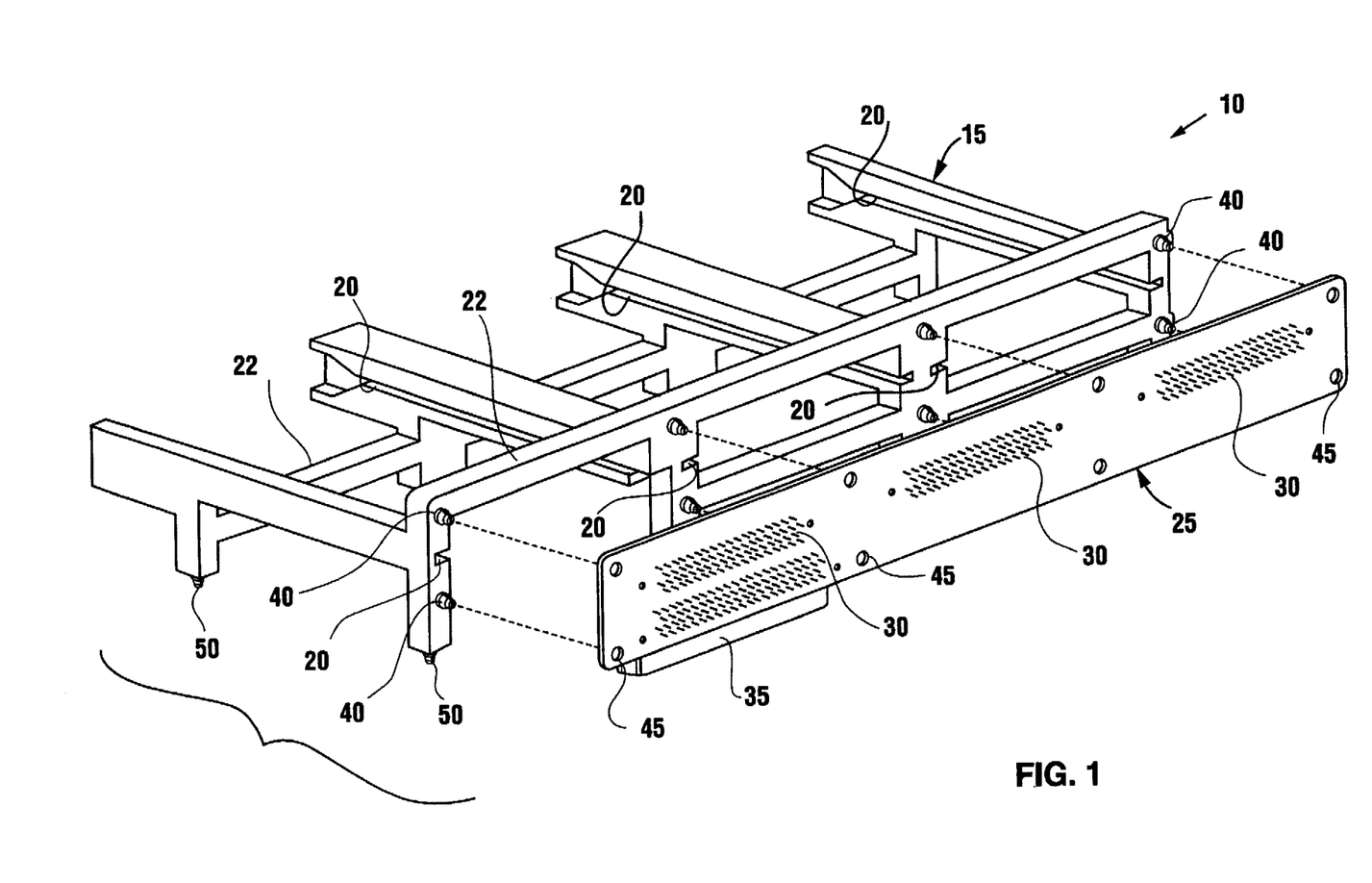
FIGS. 1 and 2 are front and rear perspective exploded views of the present invention integrated guide mount system for interfacing a PCA card to a host PCA.
Figure 2:
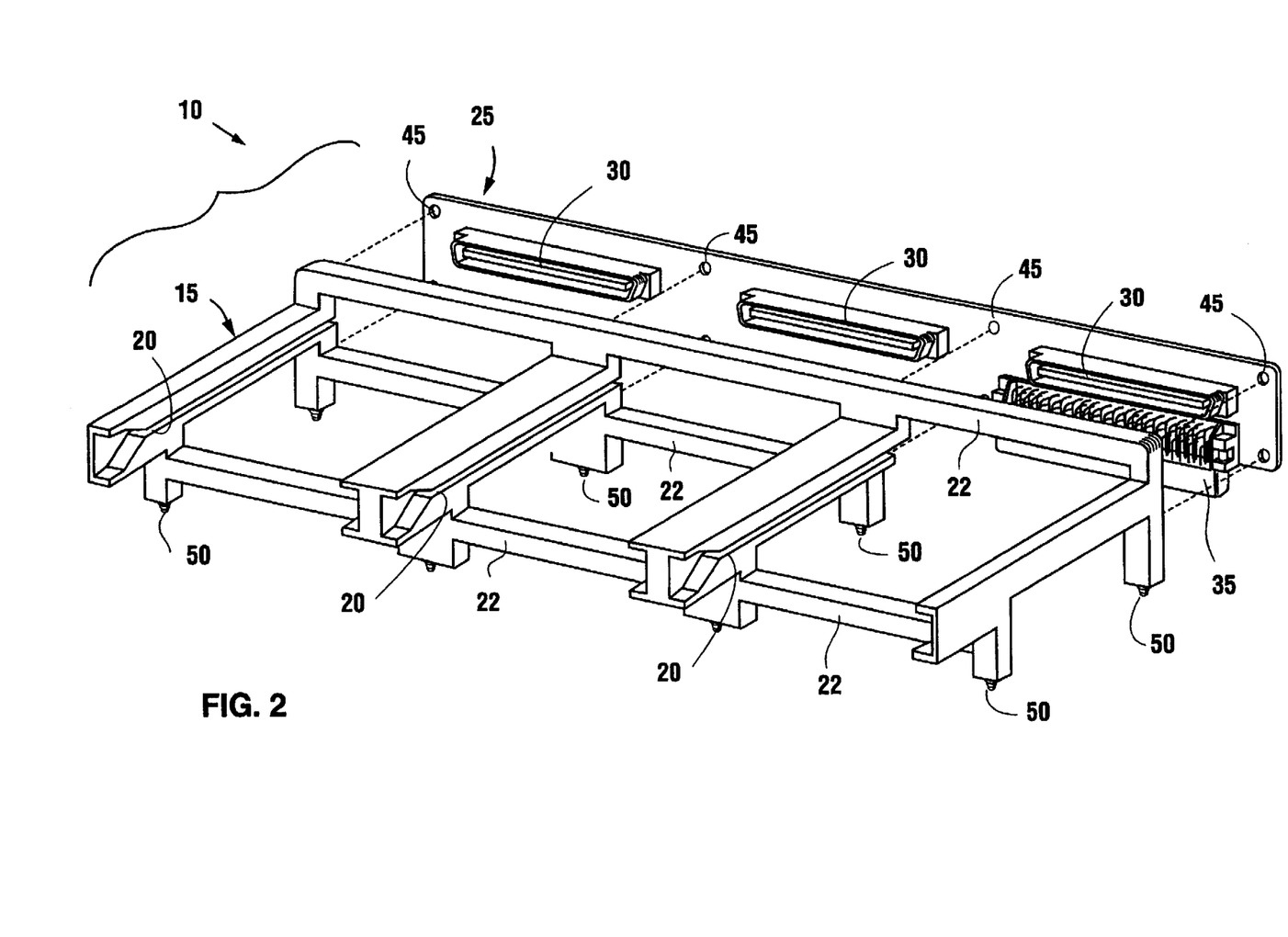

FIGS. 1 and 2 are front and rear perspective exploded views of the present invention integrated guide mount system shown generally at 10 for receiving and interfacing a PCA card, such as an input output (I/O) card, to a host PCA (mother/system board). For purposes of this disclosure, a printed circuit assembly (PCA) is a printed circuit board (PCB) having at least one component mounted thereto, the component being any integrated circuit chip, device, connector, or the like.

Integrated guide mount system 10 includes a first body (frame) 15 that is removably attachable to a mother board (not shown). First body 15 acts as a guide for slidably receiving and housing at least one PCA card (not shown) in rail slots 20. Frame 15 is made, formed, or molded of any suitable, conventional material. Guide mount system 10 further includes second body (PCA plate or satellite/daughter card) 25 that is removably attachable to a mounting plane of first body 15 for electrically interfacing the at least one PCA card with the mother board. First connector 30 aligns with rail slots 20 to interface with a connector on the PCA card when the card is received in the slots. Second connector 35 electrically communicates with connectors 30 to interconnect them to a connector on the mother board.

In a preferred embodiment, frame 15 is adapted to slidably receive, house, and interconnect at least one PCA card to the mother board. However, in the embodiment depicted, three separate PCA cards are slidably receivable within frame 15. Each of the three PCA cards interconnect with a respective first connector 30 in plate 25, and thereby to the mother board through second connector 35. Although frame 15 depicts the capability of slidably receiving three separate PCA cards, it is obvious that frame 15 could be adapted to receive any of a plurality of cards, either in a horizontal fashion as shown, or in a vertical fashion, or even in a stacked fashion, so long as plate 25 is adapted to interoperably mate with frame 15 and the mother board accordingly. At least one cross member 22 is affixed to the rails for retaining the rails in a parallel configuration for slidably receiving the PCA card.

Figure 3:
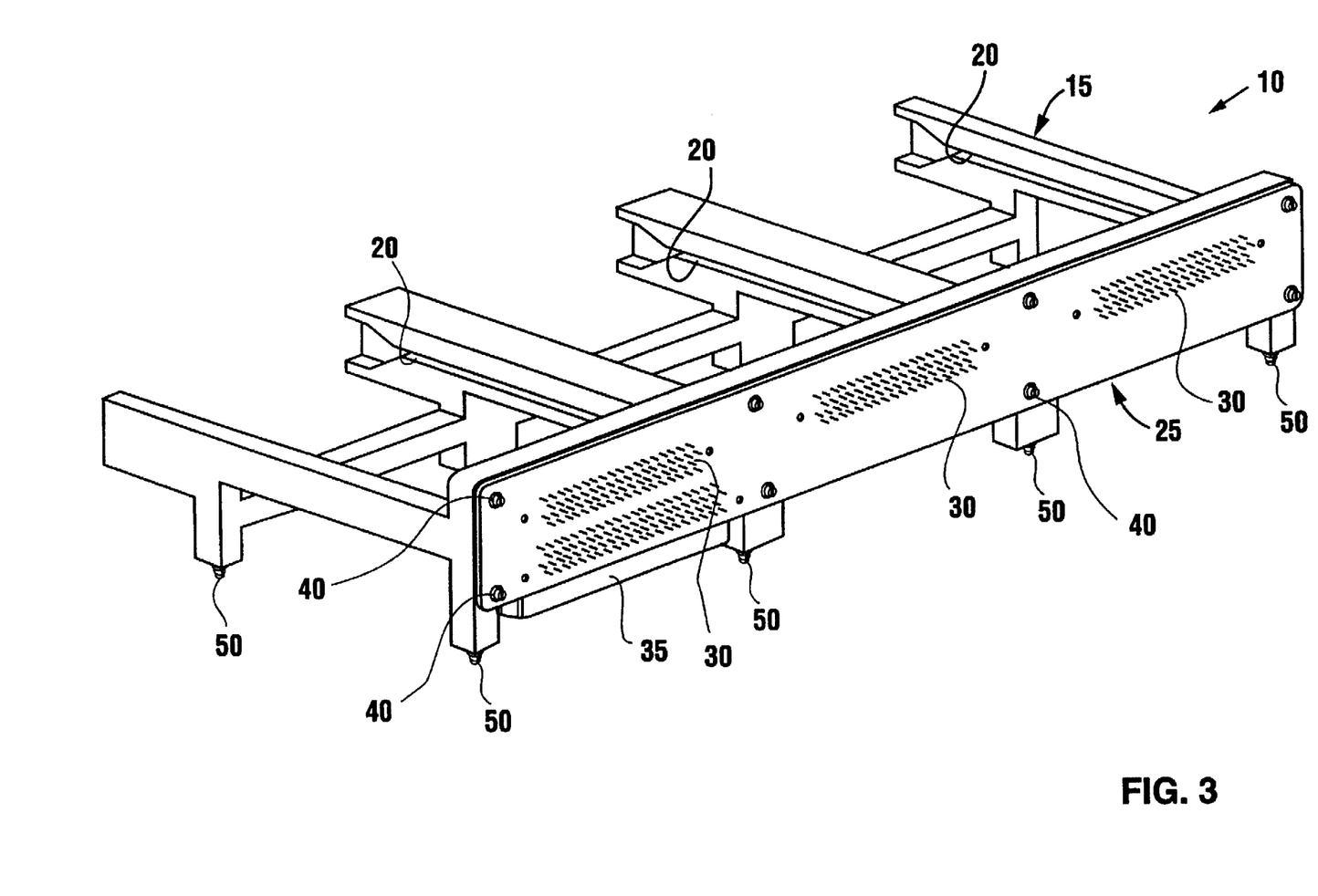
FIGS. 3 and 4 are front and rear perspective views of the present invention showing the daughter card plate mounted to the frame.
Figure 4:
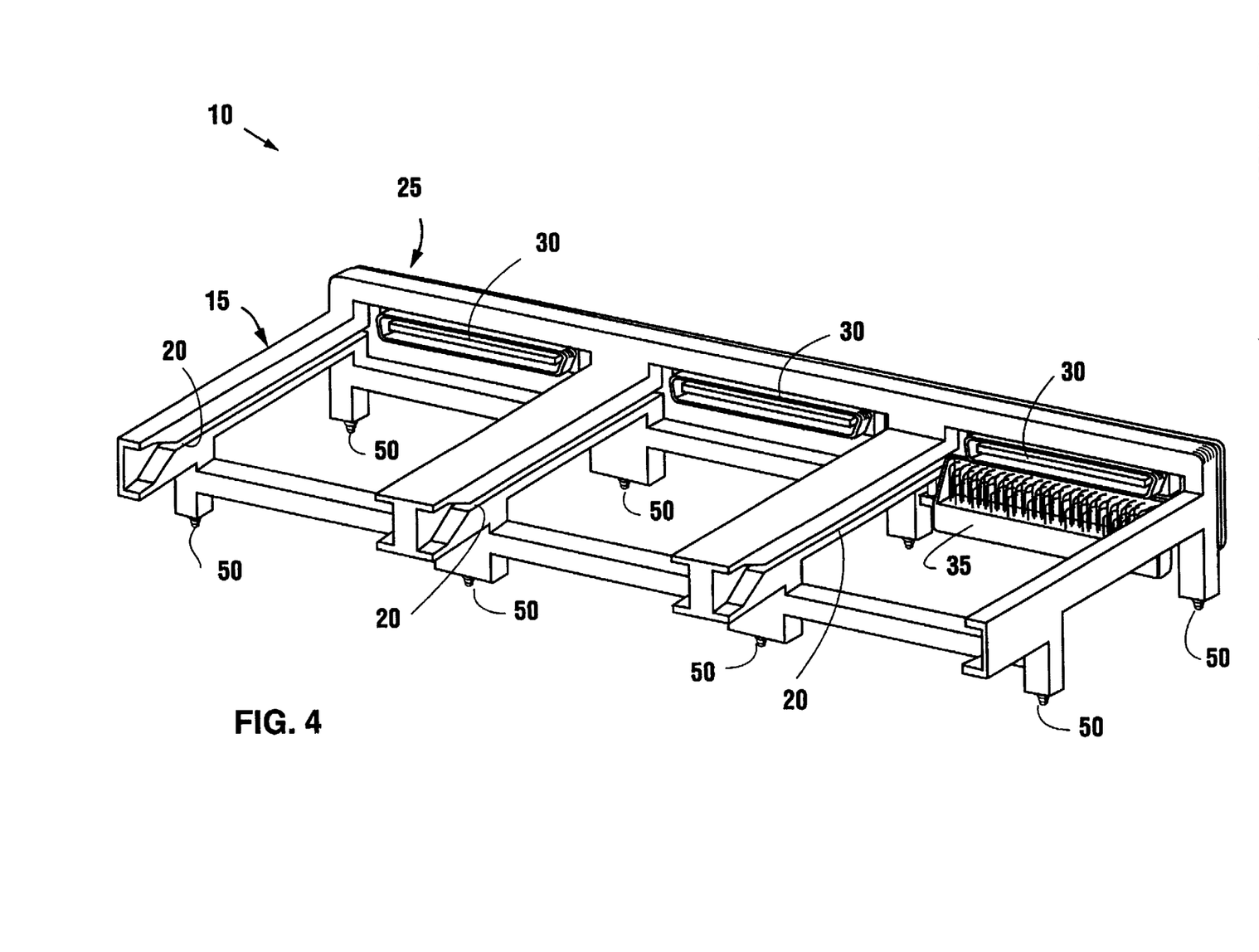

FIGS. 3 and 4 are front and rear perspective views of the present invention showing plate 25 mounted to frame 15. Further to FIGS. 1-4, snap mounts 40 of frame 15 are mated with holes 45 of plate 25 as a preferred method of detachably securing plate 25 to frame 15. Snap mounts 40 and holes 45 are aligned such that second connectors 30 correctly align to interconnect with connectors on the PCA cards when the cards are slidably inserted into frame 15. Similarly, snap mounts 50 of frame 15 mate with holes in the mother board (see FIG. 5) for detachably securing frame 15 to the mother board. It should be noted that although some form of snap or hook mounts are preferred, it is obvious that numerous variations for affixing the plate to the frame and the frame to the mother board may equally suffice. However, the mount system is preferably molded into the part and provides for quick and easy assembly which equates to lower overall manufacturing and assembly costs.

Figure 5:
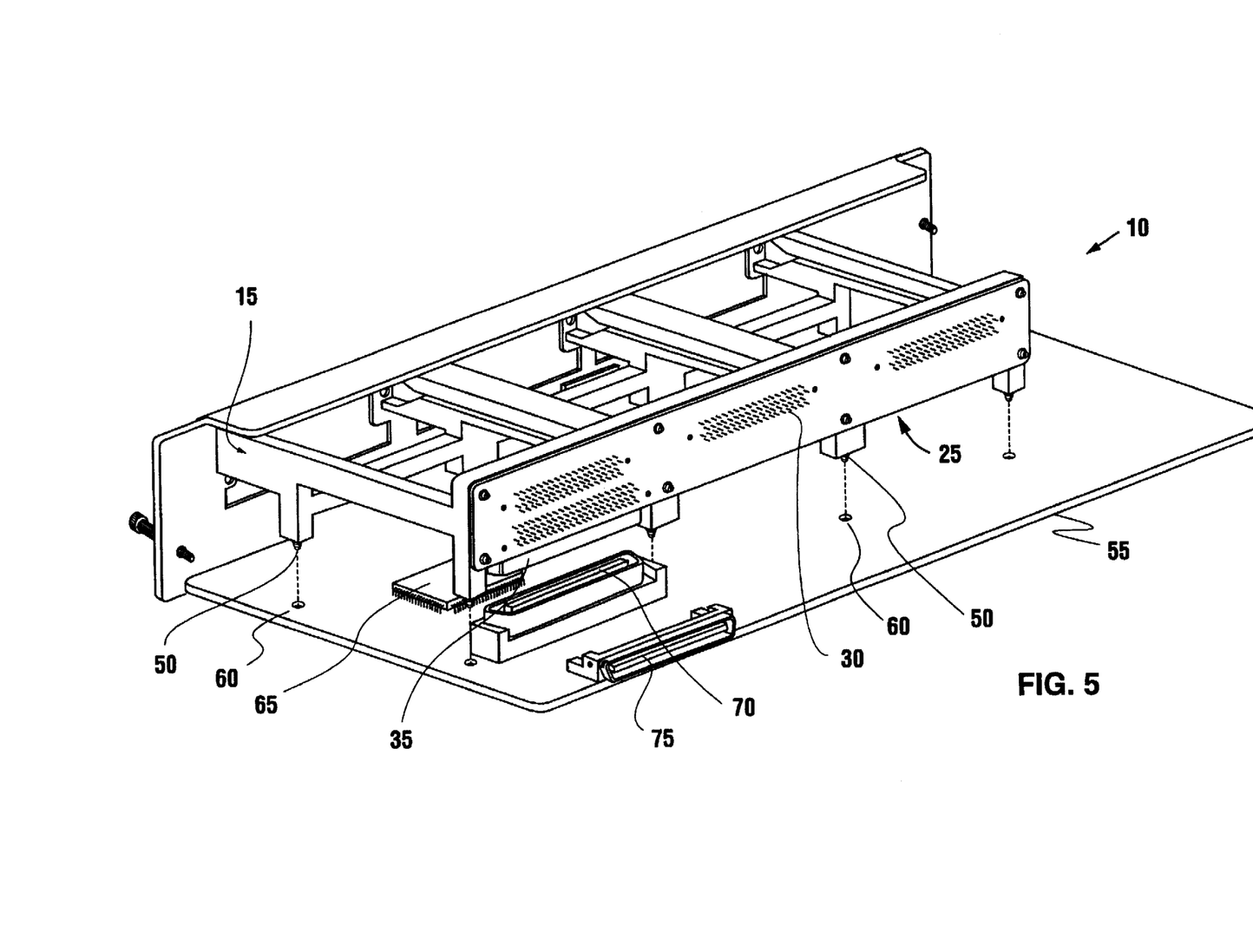
FIG. 5 is a perspective exploded view showing how the integrated guide mount system interfits with a host PCA.
Figure 6:
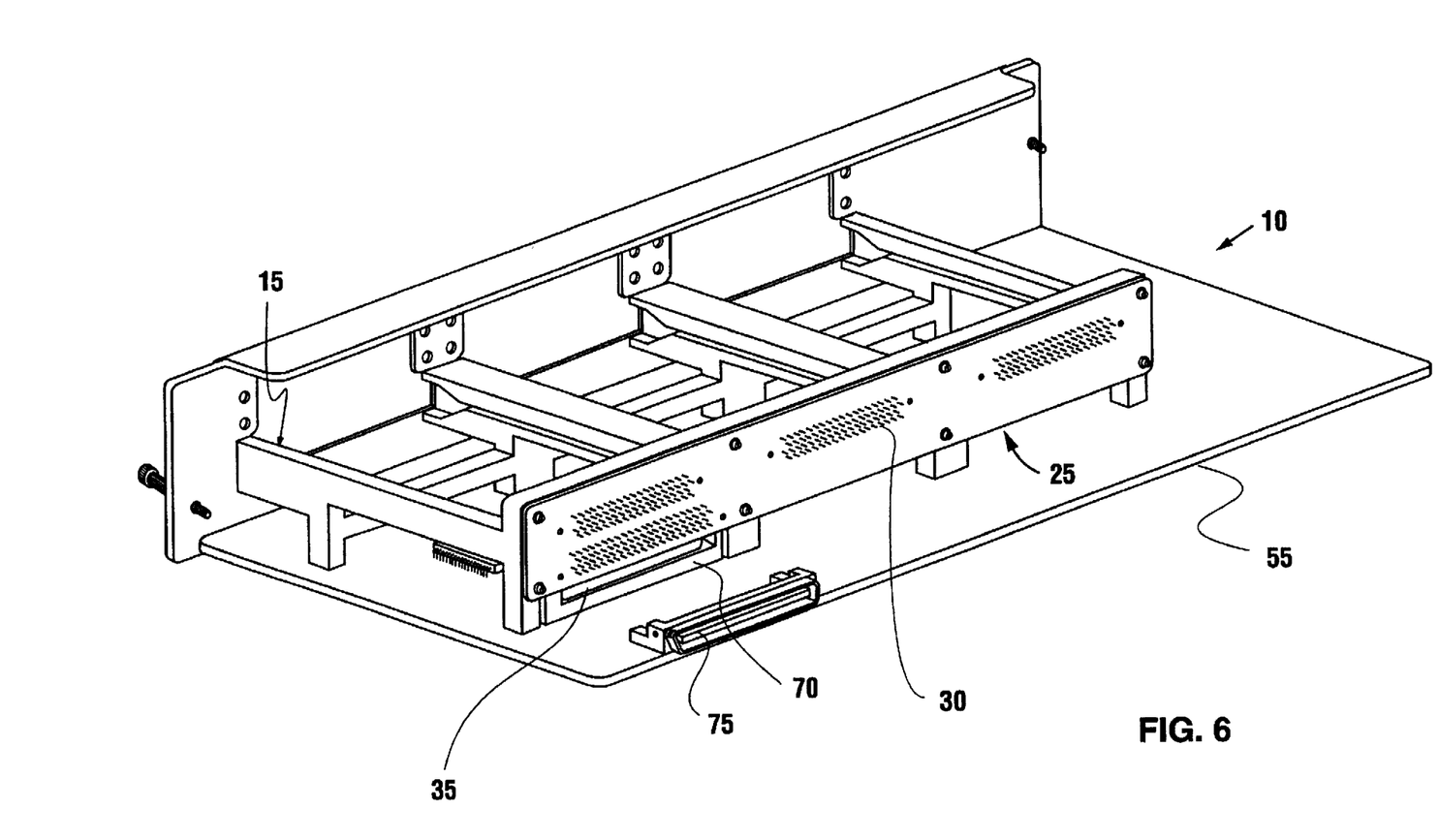
FIG. 6 is a perspective view of the integrated guide mount system attached to the host PCA.

FIGS. 5 depicts an exploded view showing how integrated guide mount system 10 interfits with host PCA (system/mother board) 55, and FIG. 6 depicts system 10 attached to host 55. With plate 25 attached to frame 15, the frame is snap fitted to system board 55. System board 55 may be any PCA with which interconnection is desired and may include any conventional circuitry as shown at 65. Snap mounts 50 of frame 15 interfit with holes 60 of system board 55 to secure the frame to the system board. Second connector 35, attached to plate 25, interconnects with third connector 70 on system board 55. Snap mounts 50 and holes 60 are aligned such that second and third connectors 35 and 70 correctly interconnect for proper electrical signal integrity. Fourth connector 75 on system board 55 interconnects the system board, and any PCA cards received and connected in frame 15, with a separate host system (not shown).

Figure 7:
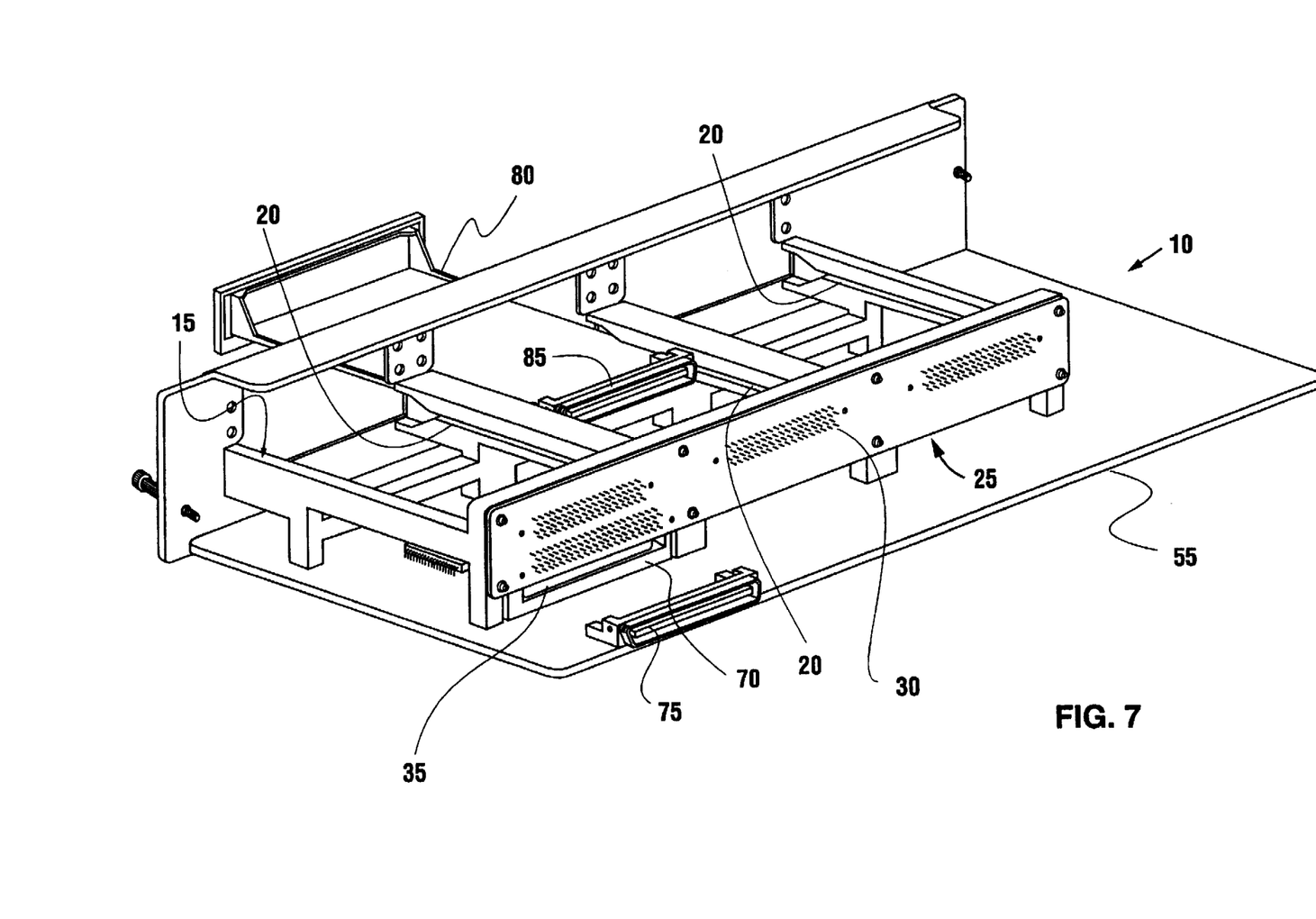
FIG. 7 is a perspective view of the integrated guide mount system attached to the host PCA and having a slide-in PCA card partially received in the guide mount system.

FIG. 7 shows integrated guide mount system 10 attached to host PCA 55 and having slide-in PCA card 80 partially received in rail slots 20 of frame 15. Card 80 may be any conventional PCA card, such as an input/output (I/O) card, or the like, adapted to be slidably received into frame 15 and interfaced with host PCA 55. PCA card 80 slides into frame 15 on parallel rail slots 20, and connector 85 on PCA card 80 interfaces with connector 30 on plate 25. As previously discussed, connector 30 interfaces with connector 35 which interfaces with connector 70 on mother board 55.

Figure 8:
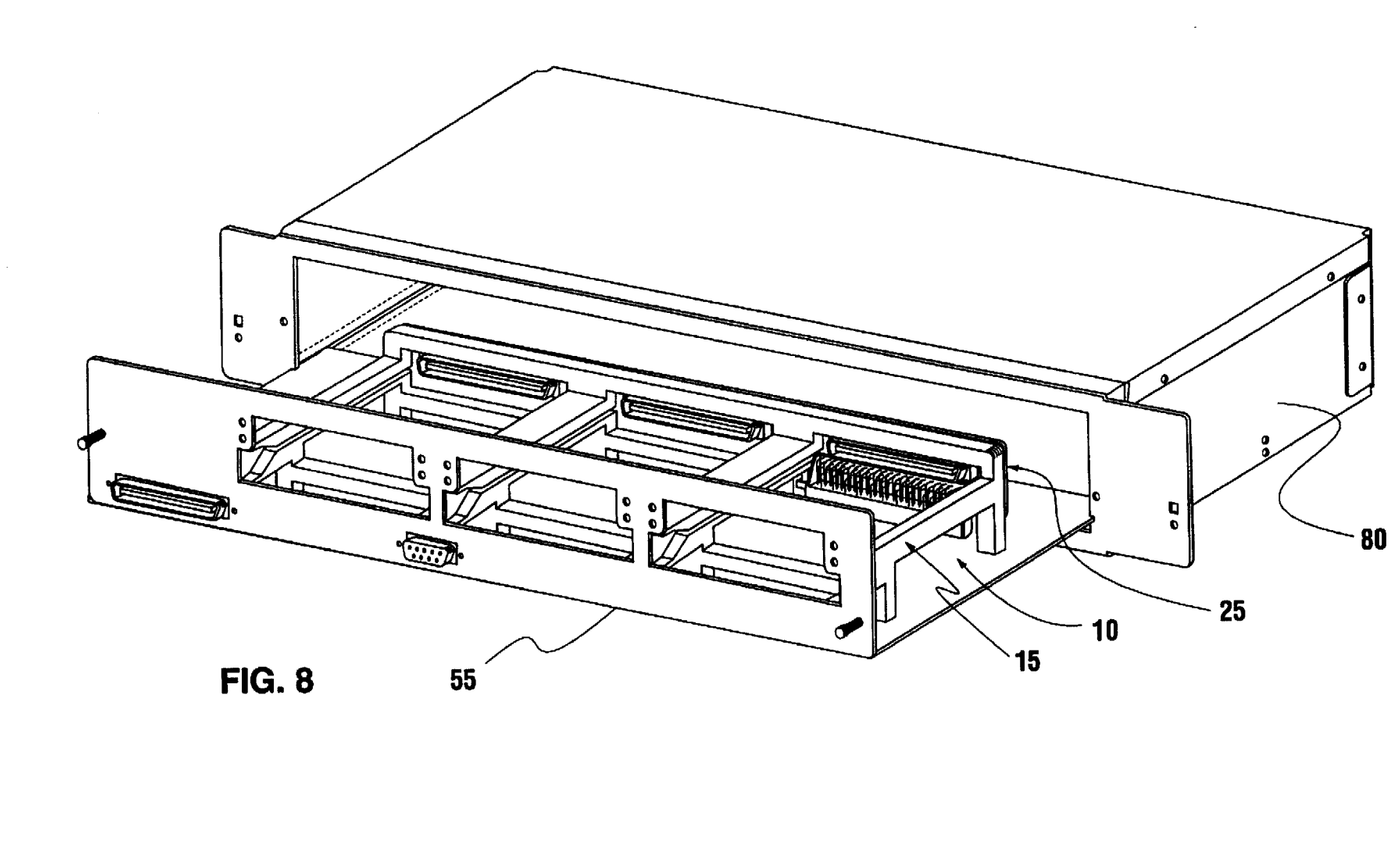
FIG. 8 is a perspective view of a system level installation and usage of a host PCA employing the integrated guide mount system.

FIG. 8 shows a system level installation and usage of mother board assembly 55 employing multi-functional I/O card guide mount system 10. The mother board and guide mount system are partially inserted into housing 80.

In summary, an integrated I/O card guide and daughter card mount system provide a low cost design, ease of manufacturability, and ease of usability for interfacing I/O cards with a host system. This multi-functional card guide provides accuracy of alignment for the slidably receivable I/O card, and provides a strategically located mounting plane for a satellite (daughter) card which bridges the connection between the I/O card and the system board. This novel configuration is employed to eliminate the disadvantages of the conventional high rise connector solution and backplane solution as previously discussed.

This multi-functional I/O card guide system is low cost because it does not require custom parts like the high rise connector system, and does not require extra mounting space and hardware like the backplane system. This system is easily manufacturable and usable because, in a preferred embodiment, the daughter card snaps directly onto the mounting plane of the I/O card guide frame, and the joined card guide frame and daughter card assembly is then easily snapped directly onto the system board.

The present invention system provides excellent alignment accuracy between the I/O card and the interfacing daughter card connector because of a short tolerance path between the I/O card and the interfacing connector. The system also minimizes coplanarity problems typically associated with conventional high rise connectors and/or backplane solutions for interfacing an I/O card to a host.

Finally, what has been described above are the preferred embodiments for a system and method of interfacing a slide-in I/O card with a mother board. It will be obvious that the present invention is easily implemented utilizing any of a variety of hardware existing in the art. Furthermore, while the present invention has been described by reference to specific embodiments, it will be obvious that other alternative embodiments and methods of implementation or modification may be employed without departing from the true spirit and scope of the invention.

What is claimed is:

1. A guide mount system for interfacing at least one printed circuit assembly (PCA) card to a host PCA, the guide mount system comprising:
   (a) a first body attachable to the host PCA for slidably receiving the at least one PCA card; and,
   (b) a second body attachable to the first body for electrically interfacing the at least one PCA card with the host PCA, and wherein the second body includes a PCA plate having:
      (i) at least a first connector means for electrically interconnecting with the at least one PCA card;
      (ii) at least a second connector means electrically interconnected with the first connector for adaptively interconnecting with the host PCA, and wherein the second connector means is the only direct physical connection between the second body and the host PCA; and,
      (iii) attachment means for attaching the PCA plate to the first body such that a connector on the PCA card mates with the at least first connector means on the PCA plate when the PCA card is received in the first body.

2. The guide mount system of claim 1 wherein the first body includes a frame having:
   (a) at least a pair of parallel slotted rails for slidably receiving the at least one PCA card;
   (b) at least one cross member affixed to the parallel rails for retaining the rails in a parallel configuration;
   (c) first attachment means for attaching the second body to the frame; and,
   (d) second attachment means for attaching the frame to the host PCA.

3. The guide mount system of claim 1 wherein, selectively, the host PCA and first body are removably attached, and the first body and second body are removably attached.

4. The guide mount system of claim 3 wherein, selectively, the host PCA and first body, and first body and second body, are removably attached by means of snap mounts.

5. The guide mount system of claim 1 wherein the PCA card is an input output (I/O) PCA card relative to the host PCA.

6. An integrated guide mount system for electrically interconnecting at least one PCA input output (I/O) card to a mother board PCA, the integrated guide mount system comprising:
   (a) a frame for slidably receiving the at least one PCA card, the frame including means for detachably mounting the frame to the mother board PCA; and,
   (b) a PCA satellite card detachably mountable to the frame, the satellite card having at least a first connector for mating with a connector on the received PCA card, and at least a second connector electrically interconnecting with the first connector for interfacing with a third connector on the mother board PCA, and wherein the second connector is the only direct physical connection between the PCA satellite card and the mother board PCA.

7. A method of interfacing a PCA card to a host PCA for establishing electrical connection between the PCA card and the host PCA, the method comprising:
   (a) attaching a PCA plate to a guide mount frame whereby at least a first electrical connector on the PCA plate aligns between rails of the guide mount frame, the first connector for interconnecting with a connector on the PCA card when the PCA card is slidably received in the rails;
   (b) attaching the guide mount frame to the host PCA whereby at least a second electrical connector on the plate aligns and interconnects with a third connector on the host PCA, and wherein the second connector is the only direct physical connection between the PCA plate and the host PCA; and,
   (c) slidably inserting the PCA card in the rails of the guide mount frame and interconnecting the connector on the PCA card to the first connector.

8. The method of claim 7 wherein step (c) is performed between steps (a) and (b) such that the PCA card is slidably inserted in the rails before the guide mount frame is attached to the host PCA.

* * * * *